US008947920B2

(12) United States Patent
Takahashi et al.

(10) Patent No.: US 8,947,920 B2
(45) Date of Patent: Feb. 3, 2015

(54) MEMORY DEVICE

(71) Applicants: Masahiro Takahashi, Seongnam-si (KR); Tsuneo Inaba, Seongnam-si (KR); Dong Keun Kim, Icheon-si (KR); Ji Wang Lee, Icheon-si (KR)

(72) Inventors: Masahiro Takahashi, Seongnam-si (KR); Tsuneo Inaba, Seongnam-si (KR); Dong Keun Kim, Icheon-si (KR); Ji Wang Lee, Icheon-si (KR)

(*) Notice: Subject to any disclaimer, the term of this patent is extended or adjusted under 35 U.S.C. 154(b) by 0 days.

(21) Appl. No.: 14/018,148

(22) Filed: Sep. 4, 2013

(65) Prior Publication Data
US 2014/0286088 A1 Sep. 25, 2014

Related U.S. Application Data

(60) Provisional application No. 61/804,489, filed on Mar. 22, 2013.

(51) Int. Cl.
*G11C 11/00* (2006.01)
*G11C 11/16* (2006.01)
(52) U.S. Cl.
CPC .......... *G11C 11/1673* (2013.01); *G11C 11/161* (2013.01)
USPC ...... 365/158; 365/148; 365/163; 365/189.07; 365/189.09
(58) Field of Classification Search
CPC .... G11C 11/1673; G11C 11/161; G11C 7/06; G11C 13/0002; G11C 13/004
USPC ................... 365/158, 100, 148, 163, 189.07, 365/189.09, 207
See application file for complete search history.

(56) References Cited

U.S. PATENT DOCUMENTS

| 7,649,792 | B2 | 1/2010 | Ueda et al. |
| 8,644,056 | B2* | 2/2014 | Oh ................................ 365/158 |
| 2009/0010045 | A1 | 1/2009 | Ueda |
| 2009/0201717 | A1* | 8/2009 | Maeda et al. ................. 365/148 |
| 2011/0188325 | A1* | 8/2011 | Kajigaya .................. 365/189.09 |
| 2012/0286339 | A1 | 11/2012 | Asao |

FOREIGN PATENT DOCUMENTS

| JP | 2009-015949 A | 1/2009 |
| JP | 2009-187631 A | 8/2009 |
| JP | 2012-243364 A | 10/2012 |

* cited by examiner

*Primary Examiner* — Tan T. Nguyen
(74) *Attorney, Agent, or Firm* — Holz, Holtz, Goodman & Chick PC

(57) ABSTRACT

According to one embodiment, a memory device includes a memory cell, a sense amplifier, unit structures and a reference signal generator. Each structure includes a first end, a first transistor, a first local line, a variable resistance element, a second transistor, a second local line, and a third transistor coupled in series. The reference signal generator includes first to fourth global lines, and first and second ones of the unit structures. The first unit structure is coupled at the first end to the first global line and coupled at the second end to the third global line. The second unit structure is coupled at the first end to the fourth global line and coupled at the second end to the second global line.

20 Claims, 8 Drawing Sheets

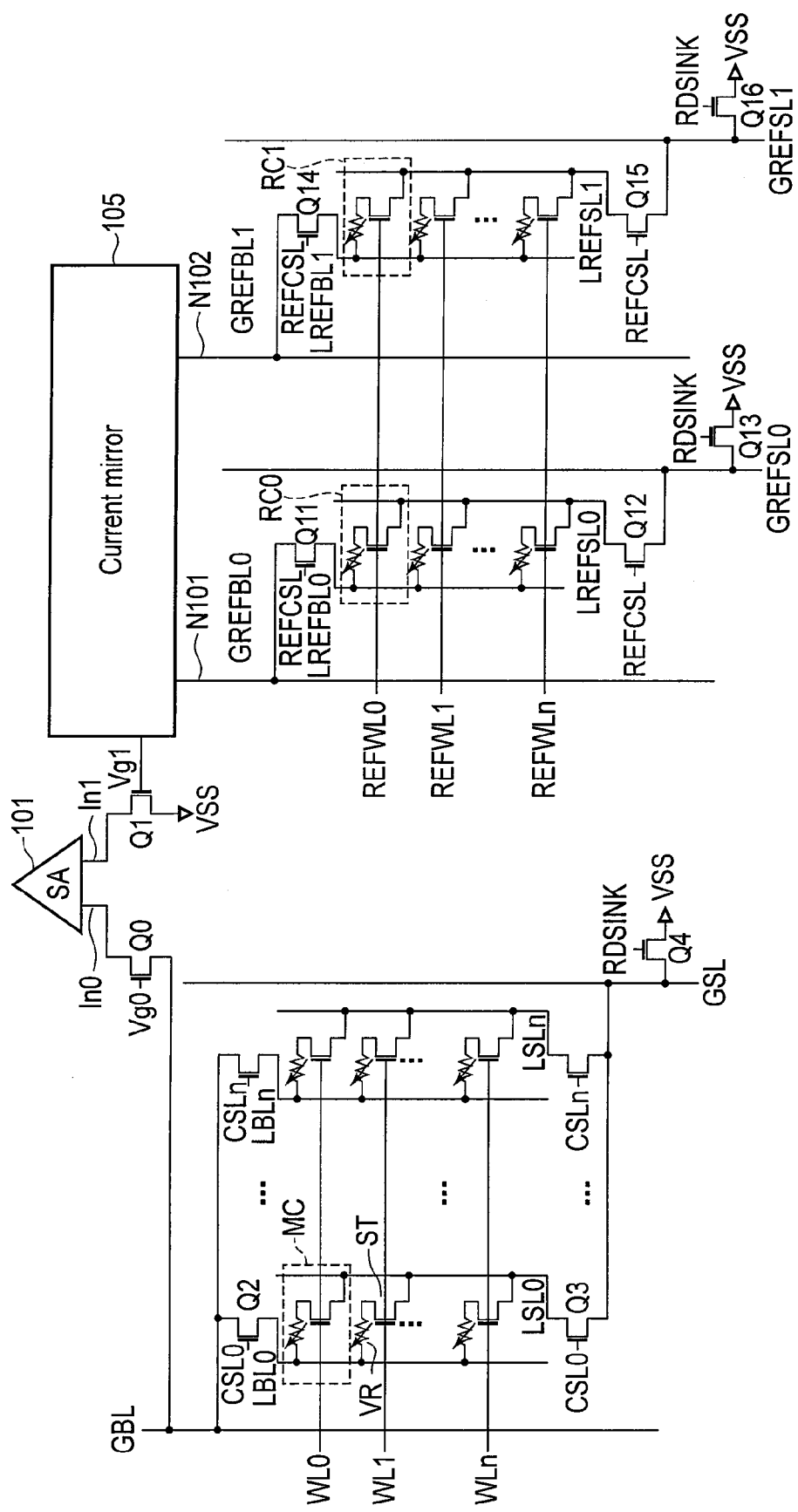
F I G. 1

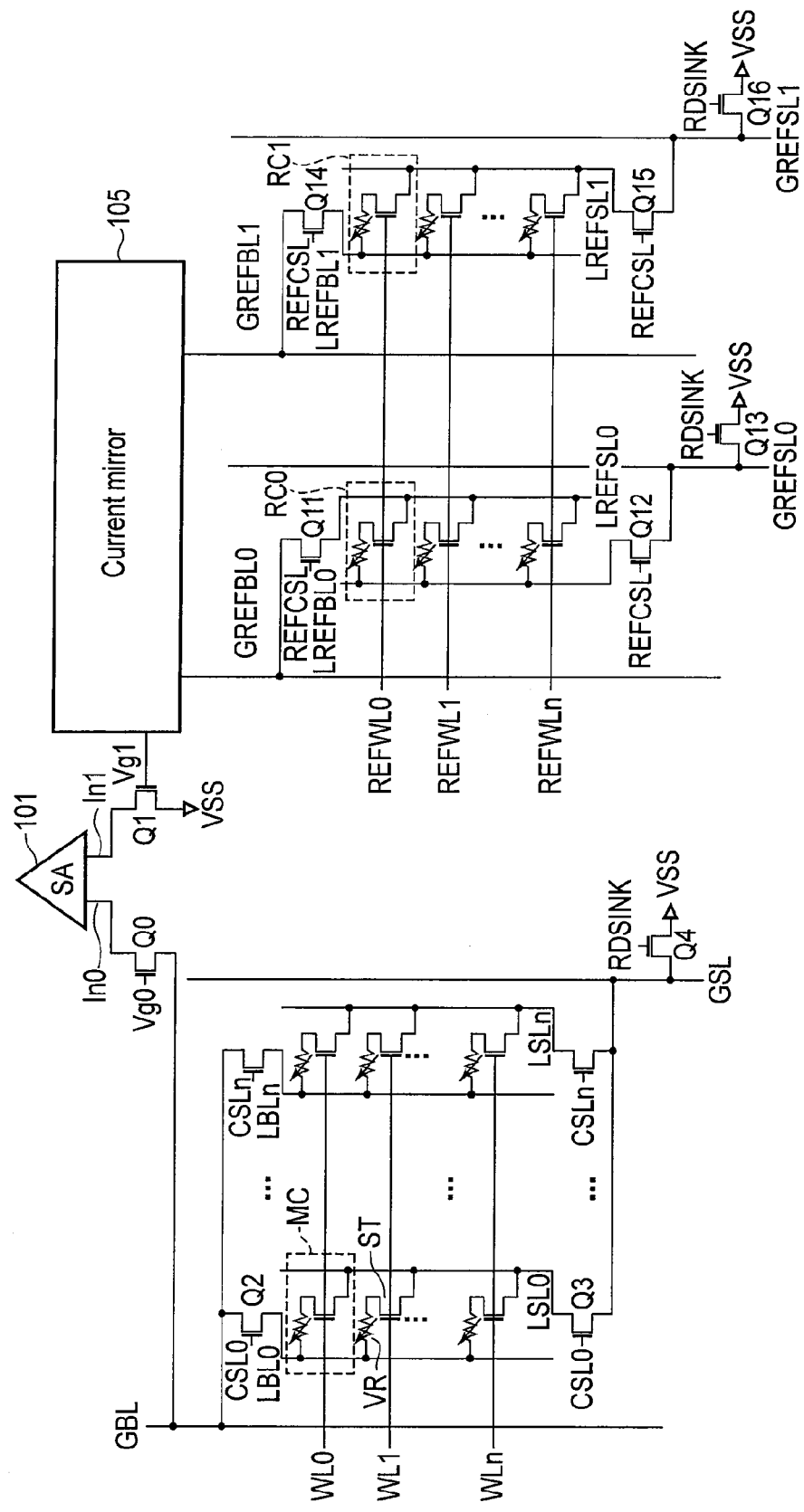
F I G. 2

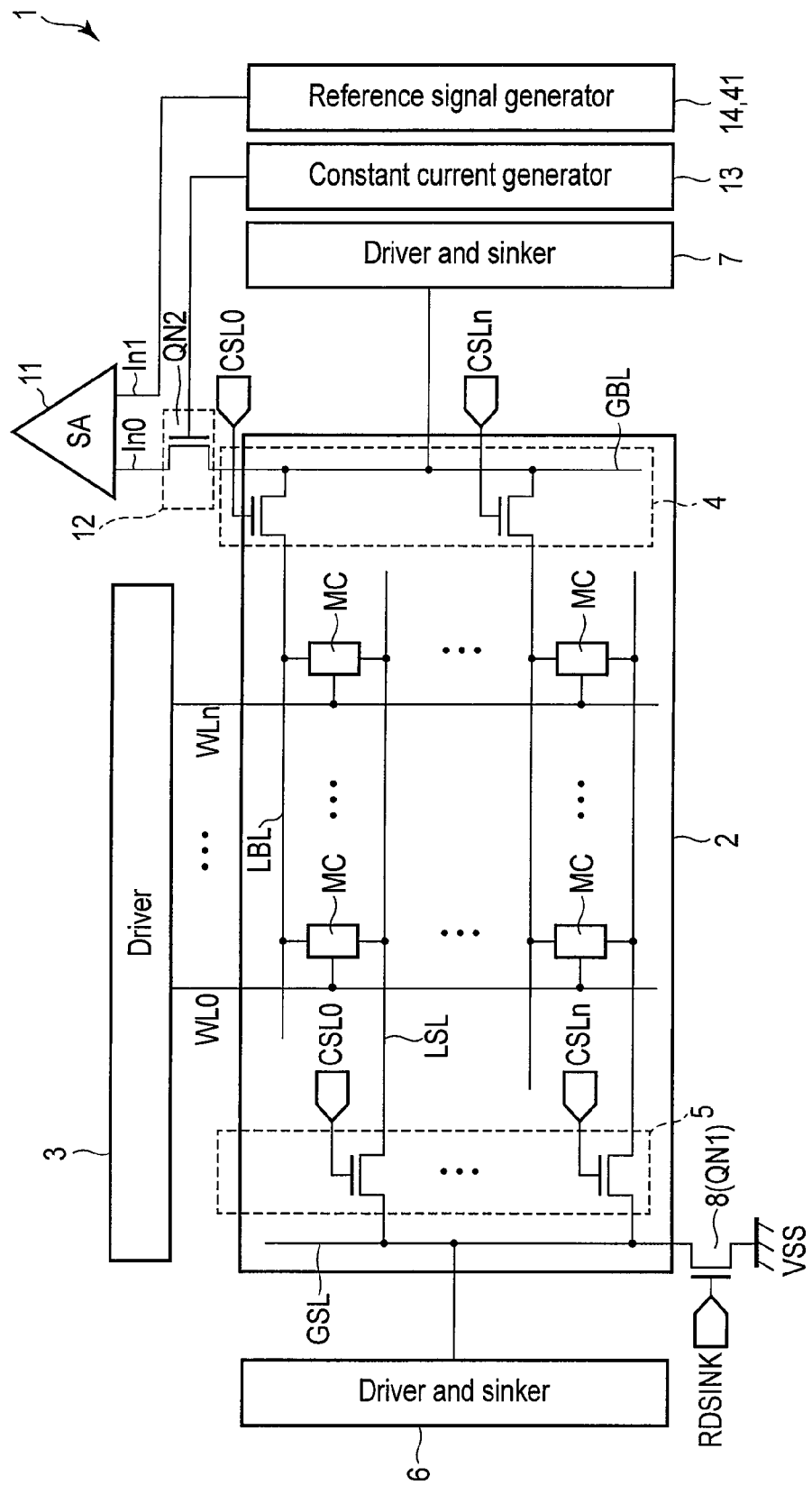
F I G. 3

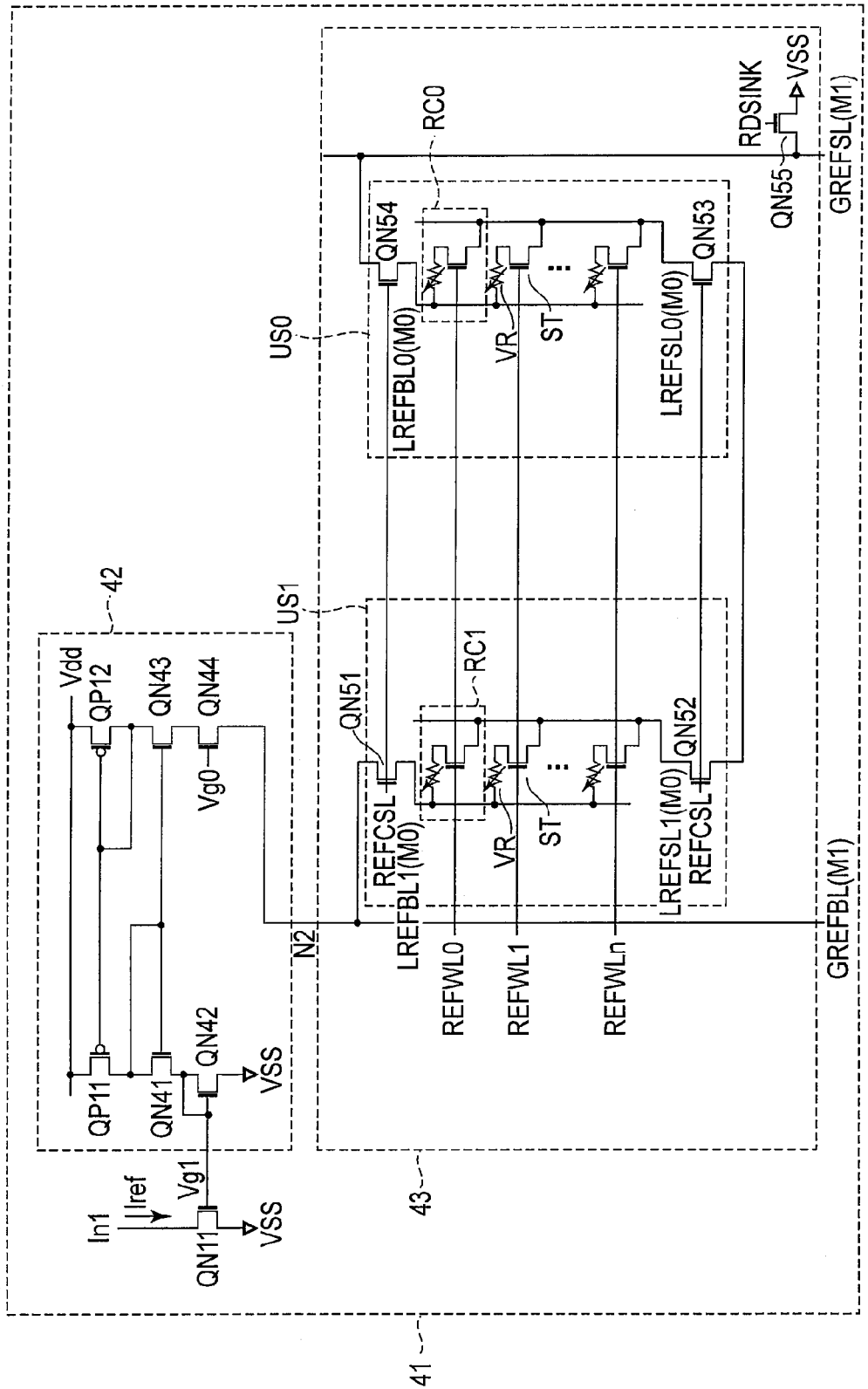
F I G. 9

MEMORY DEVICE

CROSS-REFERENCE TO RELATED APPLICATIONS

This application claims the benefit of U.S. Provisional Application No. 61/804,489, filed Mar. 22, 2013, the entire contents of which are incorporated herein by reference.

FIELD

Embodiments described herein relate generally to a memory device.

BACKGROUND

There are memory devices which use an element which takes a variable resistance as a memory cell.

BRIEF DESCRIPTION OF THE DRAWINGS

FIG. 1 illustrates an example of a structure for reads with a sense amplifier.
FIG. 2 illustrates another example of a structure for reads with a sense amplifier.
FIG. 3 is a block diagram of a memory device according to a first embodiment.
FIG. 9 is a circuit diagram of a part of a memory device according to a third embodiment.

DETAILED DESCRIPTION

Figure 4:
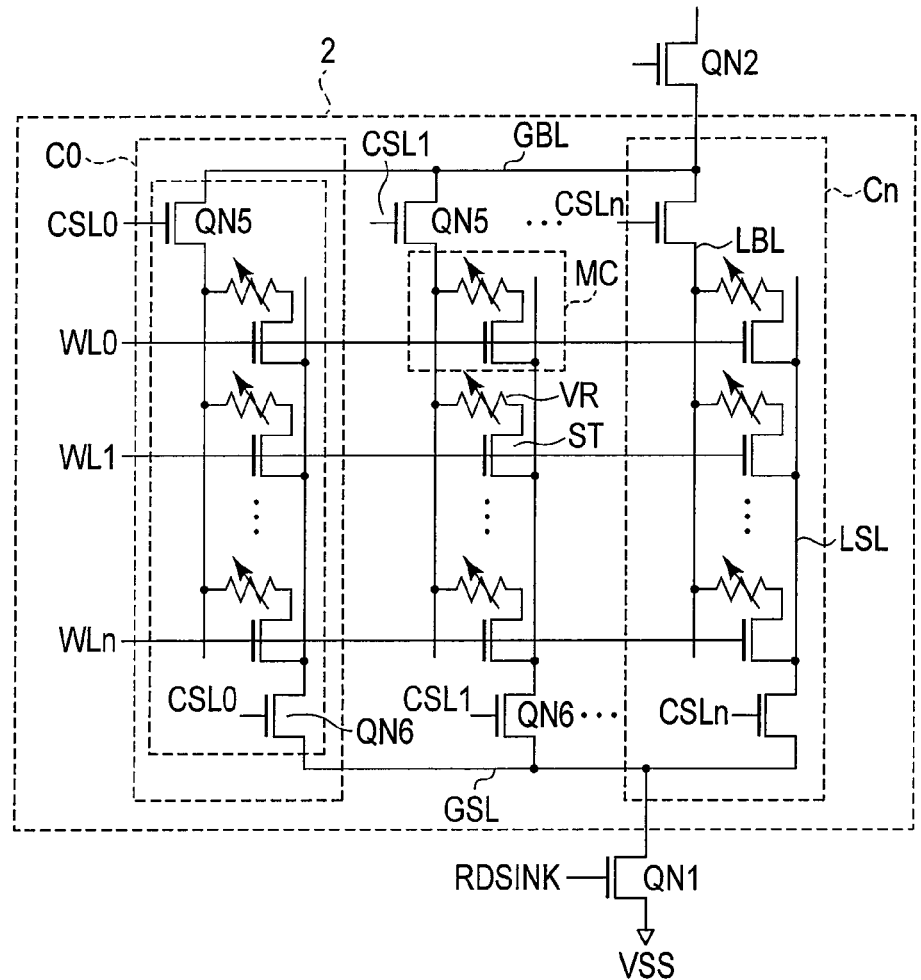
FIG. 4 illustrates a memory cell array according to the first embodiment.

In general, according to one embodiment, a memory device includes: a memory cell, a sense amplifier comprising a first input and a second input, and configured to output a signal based on a difference between the first and second inputs and be selectively coupled at the second input to the memory cell; unit structures; and a reference signal generator coupled to the first input of the sense amplifier. Each unit structure includes a first end, a first transistor, a first local line, a variable resistance element, a second transistor, a second local line, and a third transistor coupled in series. The reference signal generator includes: a first global line selectively grounded and a second global line selectively grounded; a third global line and a fourth global line; and a first unit structure and a second unit structure of the unit structures. The first unit structure is coupled at the first end to the first global line and coupled at the second end to the third global line. The second unit structure is coupled at the first end to the fourth global line and coupled at the second end to the second global line.

There are memory devices which use an element which takes a variable resistance as a cell. Such memory devices include a magnetoresistive random access memory (MRAM). MRAMs use magnetic tunnel junction (MTJ) elements for their cells. An MTJ element takes different resistance states in accordance with the direction of a current which flows through it. Two different resistance states are associated with states of storing 0 and 1 data, respectively, which allows for storing of information.

Data stored in the cells is read with, for example, a current detection type sense amplifier. FIG. 1 illustrates an example of a current detection type sense amplifier 100 disclosed by, for example, the U.S. Pat. No. 7,649,792 specification. An input In0 of the sense amplifier 101 is coupled to a global bit line (bit line) GBL via a transistor Q0. The bit line GBL is coupled to a global source line (source line) GSL via multiple columns C0 to Cn. Each of the columns C0 to Cn includes the two column select transistors Q2 and Q3, and multiple memory cells MC coupled in parallel between them. A memory cell MC includes an MTJ element MTJ and a transistor ST. A MTJ element takes one of two resistance states in accordance with a direction of a current flowing through it. Any one of the two resistance states can be referred to as 0 data holding state or 1 data holding state. In the following description, the direction of a current flowing from an MTJ element MTJ toward a transistor ST is defined as 1 data write direction for convenience. During reads, a particular cell MC is coupled between the input In0 of the sense amplifier 101 and source line SL through selection of transistors Q2, Q3, and ST. The source line GSL is grounded via a transistor Q4.

The other input In1 of the sense amplifier 101 is coupled to a transistor Q1. The transistor Q1 passes a reference current. The reference current is designed to make a current through the transistor Q1 the average of a current flowing through a memory cell MC storing 0 data and that flowing through a memory cell MC storing 1 data. To this end, the gate of the transistor Q1 is coupled to 0-data reference cells RC0 and 1-data reference cells RC1 via a current mirror circuit 105. These reference cells have the same structure as the memory cells.

A node N101 of the current mirror circuit 105 is couple to a local reference bit line LREFBL0 via a global reference bit line (or reference bit line) GREFBL0 and a transistor Q11. The local reference bit line LREFBL0 is coupled to a local reference source line LREFSEL0 via the reference cells RC0. Each reference cell RC0 stores 0 data. The local reference source line LREFSEL0 is coupled to a global reference source line (or reference source line) GREFSL0 via a transistor Q12.

Similarly, a node N102 of the current mirror circuit 105 is coupled to a local reference bit line LREFBL1 via a global reference bit line (or reference bit line) GREFBL1 and a transistor Q14. The local reference bit line LREFBL1 is coupled to a local reference source line LREFSEL1 via the reference cells RC1. Each reference cell RC1 stores 1 data. The local reference source line LREFSEL1 is coupled to a global reference source line (or reference source line) GREFSL1 via a transistor Q15.

In order to generate the reference current, the reference source line GREFSL0 and GREFSL1 are grounded via transistors Q13 and Q16, respectively, and current flows through a particular reference cell RC0 and a particular reference cell RC1. Both the reference cells RC0 and RC1 receive currents from the current mirror circuit 105 from their MTJ element sides. Specifically, both reference cells RC0 and RC1 receive 1-data write current during reads. This may change 0 data stored by the reference cell RC0. This in turn makes data reads impossible. Moreover, the reference cells are generally shared by many sense amplifiers to increase efficiency, and therefore destruction of reference data will affect many data reads.

To combat the backgrounds described above, a structure shown in FIG. 2 is proposed. FIG. 2 illustrates another example structure for reads with a sense amplifier. As shown in FIG. 2, the transistor Q11 is coupled to the local reference source line LREFSL0, and the transistor Q12 is coupled to the local reference bit line LREFBL0. This connection allows the current from the current mirror circuit 105 to flow through a particular reference cell RC0 as 0-data write current. These components whose connections to be altered are, however, positioned in a fine pitch area where interconnects are provided most densely. Disrupting the periodicity in the fine pitch area for the above connection change complicates chip manufacture. This induces defects in the area with the altered connections.

The description so far has been made to a current detection type sense amplifier. A voltage detection type sense amplifier, however, also compares a voltage at a data cell side with a voltage at a reference side, and therefore suffers from the same problem as that of the above current detection type sense amplifier.

Embodiments will now be described with reference to figures. Components with substantially the same functionalities and configurations will be referred to with the same reference numbers and duplicate descriptions will be made only when required. Moreover, for a description for an embodiment omitted due to duplication, a corresponding description for another embodiment is applied unless otherwise indicated. The embodiments only illustrate devices and methods which embody the technical idea thereof, and the technical idea do not limit the material, dimension, structure, and arrangement of components to the following ones. The technical idea of the embodiments may be variously changed in accordance with the scope of the claims.

First Embodiment

FIG. 3 illustrates a block diagram of a memory device according to a first embodiment. As shown in FIG. 3, a memory device 1 includes a memory cell array 2, a driver 3, column selectors 4 and 5, driver/sinker sets 6 and 7, a sinker 8, a sense amplifier 11, a clamp circuit 12, a constant current generator 13, a reference signal generator 14, etc. The reference signal generator 41 will be described in a third embodiment.

Each functional block does not necessarily need to be distinguished this way. For example, some of functionalities may be implemented by functional blocks different from those illustrated below. Furthermore, an illustrated functional block may be divided into functional sub-blocks. The embodiments are not limited by the specification of the particular functional blocks.

The memory cell array 2 includes cells MC, a global bit line GBL, a global source line GSL, local bit lines LBL, local source lines LSL, word lines WL, and column selectors 4 and 5, etc. Each memory cell MC is coupled between a local bit line LBL and a local source line LSL, and coupled to a word line WL. Each memory cells MC includes at least a variable resistance element. The variable resistance element can take multiple resistance states with different magnitudes. As a variable resistance element, an MTJ element used for MRAMs, an element used for resistive random access memories (ReRAMs), or an element used for PRAMs or phase change random access memories (PCRAMs) is used, for example. Any mechanism of resistance change is possible, and does not limit the present embodiment. The memory cell array 2 will be described in full detail later.

The driver 3 selects a particular word line WL in accordance with address signals from outside the memory device 1. The column selectors 4 and 5 select a particular column in accordance with column select signals CSL0 to CSLn. The column select signals CSL0 to CSLn are supplied, for example, from outside the memory device 1, and one of the column select signals CSL0 to the CSLn is asserted. Selection of a word line WL and a column selects one cell MC.

The driver/sinker sets 6 and 7 supply a write current to a selected memory cell MC in conjunction. When the cell MC is the MTJ element, one of the driver/sinker sets 6 and 7 serves as a driver, and the other as a sinker, for example. Specifically, one of them supplies a write current and the other draws the write current so that the write current flows through a selected memory cell MC in the direction in accordance with data to be written into the selected memory cell MC. The sinker 8 includes, for example an n-type metal oxide semiconductor field effect transistor (MOSFET) QN1, receives a signal RDSINK from a controller (not shown) or outside the memory device 1, and receives a high level signal RDSINK to be turned on during reads to couple the source line GSL to a node of a potential VSS (or a ground node VSS).

The sense amplifier 11 is provided for the memory cell array 2, and when the memory device 1 includes multiple memory cell arrays 2, a sense amplifier 11 is provided for each memory cell array 2. The sense amplifier 11 has two inputs In0 and In1, and amplifies the difference of the two inputs In0 and In1. The clamp circuit 12 clamps a potential of the drain node of the clamp circuit 12, and comprises, for example, an n-type MOSFET QN2. The constant current generator 13 supplies the gate of transistor QN2 with a voltage to clamp the drain node of the clamp circuit 12 to a desired potential. The reference signal generator 14 supplies a reference current to the input In1. The reference current is used as a reference to determine data during reads.

The memory cell array 2 includes multiple columns C0 to Cn, as shown in FIG. 4. FIG. 4 illustrates an example of the memory cell array of the first embodiment. When reference numbers with suffixes (for example, the column C) do not need to be distinguished from each other, the reference number without a suffix is used to refer to all corresponding reference numbers with suffixes.

Each column C is coupled between the global bit line GBL and global source line GSL. The global source line GSL is coupled to the ground node VSS via the sinker QN1. Each column C includes a unit structure US. Each unit structure US includes two select transistors, a local bit line, a local source line, and at least one cell. One of the select transistors configures, at its one end, one end of the unit structure US, and is coupled at its other end to the local bit line. The other select transistor configures, at its one end, the other end of the unit structure US, and is coupled at its other end to the local source line. The cells are coupled between the local source line and local bit line. Unit structures are also used in the reference signal generator 14, and have substantially the same components and connections. However, in accordance with the use of the unit structures US, their components may be referred to as different names and reference numbers, and include different numbers of cells.

Figure 5:
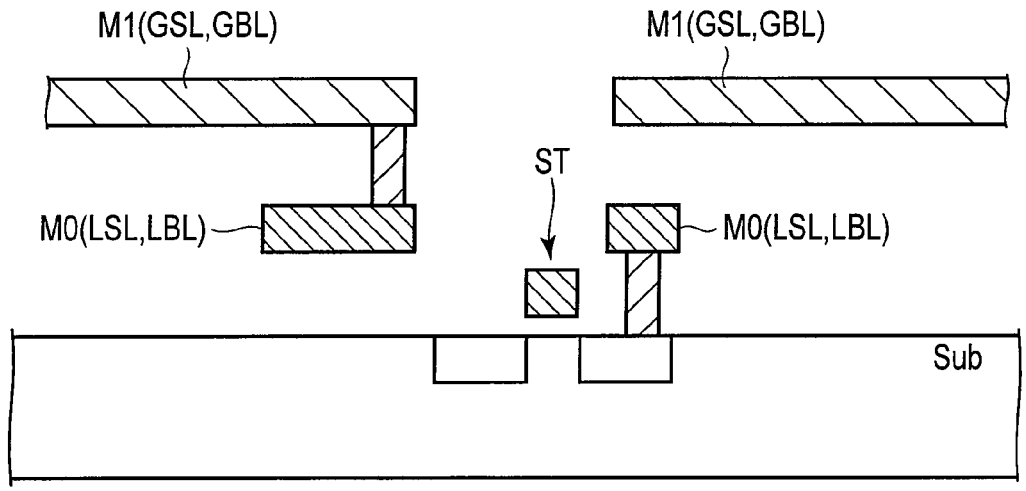
FIG. 5 is a sectional view of a part of the first embodiment.

In the memory cell array 2, the two select transistors, local source line, local bit line, and cells of a unit structure US are referred to as column select transistors (column selectors 4 and 5) QN5 and QN6, a local source line LSL, a local bit line LBL, and memory cells MC, respectively. As illustrated in FIG. 5, the local bit line LBL and the local source line LSL are formed in so-called a lowest M0 interconnect layer nearest to a substrate sub. In contrast, the global bit line GBL and global source line GSL are formed in so-called an M1 interconnect layer above the M0 interconnect layer.

Referring back to FIG. 4, each transistor QN5 is an n-type MOSFET and is coupled between the global bit line GBL and a corresponding local bit line LBL. Specifically, transistors QN5 of the columns C0 to Cn are coupled to local bit lines LBL0 to LBLn of the columns C0 to Cn, respectively. Each transistor QN6 is coupled between the global source line GSL and a corresponding local source line LSL. Specifically, transistors QN6 of the columns C0 to Cn are coupled to local source lines LSL0 to LSLn of the columns C0 to Cn.

Respective transistors QN5 of the columns C0 to Cn receive column select signals CSL0 to CSLn at their gates, respectively. Similarly, respective transistors QN6 of the columns C0 to Cn receive the column select signals CSL0 to CSLn at their gates, respectively.

Each unit structure US in the cell array 2 includes, for example, n+1 cells, which serve as the memory cells MC. The memory cells MC are arranged in a matrix in the cell array 2. Each memory cell MC includes a variable resistance element VR. The variable resistance element VR can take multiple steady resistance-states with different magnitudes. Any element can be used as the variable resistance element VR, and MTJ elements, elements used for the ReRAMs, or elements used for the PRAMs or PCRAMs are used as described above. The element used for the PRAMs or PCRAMs takes a crystal state of a low resistance state or an amorphous state of a high resistance state after current appropriately controlled flows through the cell which comprises chalcogenide, for example. The element used for the ReRAMs takes a low resistance state or a high resistance state in accordance with the polarity of voltage applied.

Each memory cell MC further includes an element in accordance with the type of the variable resistance element VR. For example, with the present embodiment applied to a ReRAM, each memory cell MC includes at least a diode and the variable resistance element VR.

With the present embodiment applied to an MRAM, each memory cell MC further includes an n-type MOSFET ST. FIG. 4 illustrates such an example. The serial structure of the variable resistance element VR and transistor ST is coupled to the local bit line LBL at its variable resistance element side and to the local source line LSL at its transistor side. Each transistor ST of the $0^{th}$ row of the columns C0 to Cn is coupled to a word line WL0 at its gate. Similarly, sets of transistors ST of respective first row to $n^{th}$ rows are coupled to word lines WL1 to WLn, respectively.

Figure 6:
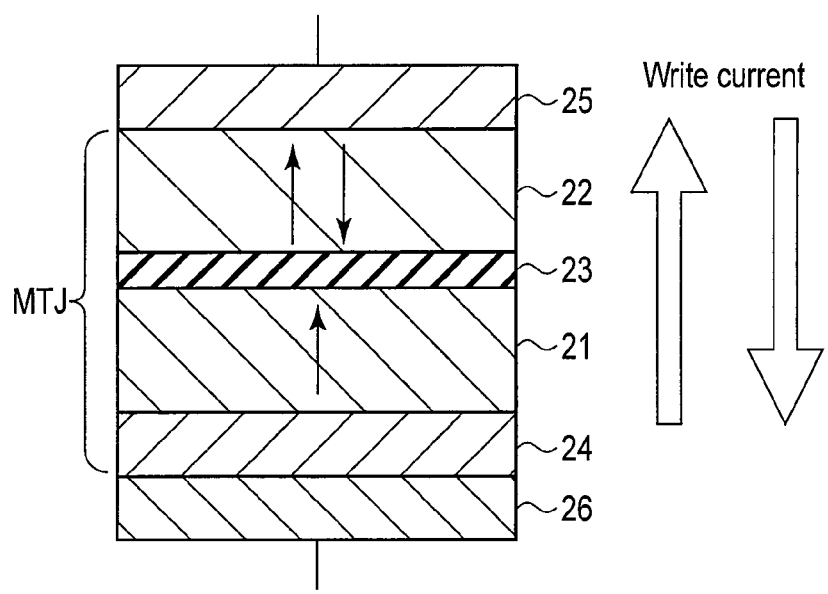
FIG. 6 illustrates an example of an MTJ element according to the first embodiment.

Each MTJ element is configured to take different steady resistance states in accordance with the direction of a current which flows through it. The phenomenon of exhibition of different resistances refers to as the magnetoresistive effect, which is used by the MTJ element to store data. FIG. 6 illustrates an example of such an MTJ element MTJ. As shown in FIG. 6, an MTJ element MTJ has a fixed layer 21, a storage layer 22, and an insulator 23 between them. The fixed layer 21 has its magnetization fixed by an antiferromagnetic layer 24. The storage layer 22 has a magnetization variable in accordance with the direction of a write current through it. The MTJ element MTJ exhibits a resistance state variable in accordance with relative relation between the direction of the magnetization of the fixed layer 21 and the direction of the magnetization of the storage layer 22. These different resistance states are associated with, for example, two values of one-bit data, respectively. As described above, any one of the two resistance states can be referred to as 0-data holding state or 1-data holding state. In the following description, the direction of a current flowing from an MTJ element MTJ toward a transistor ST is herein defined as 1-data write direction for convenience. Layers 25 and 26 are electrodes, and have the MTJ element MTJ interposed between them.

Figure 7:
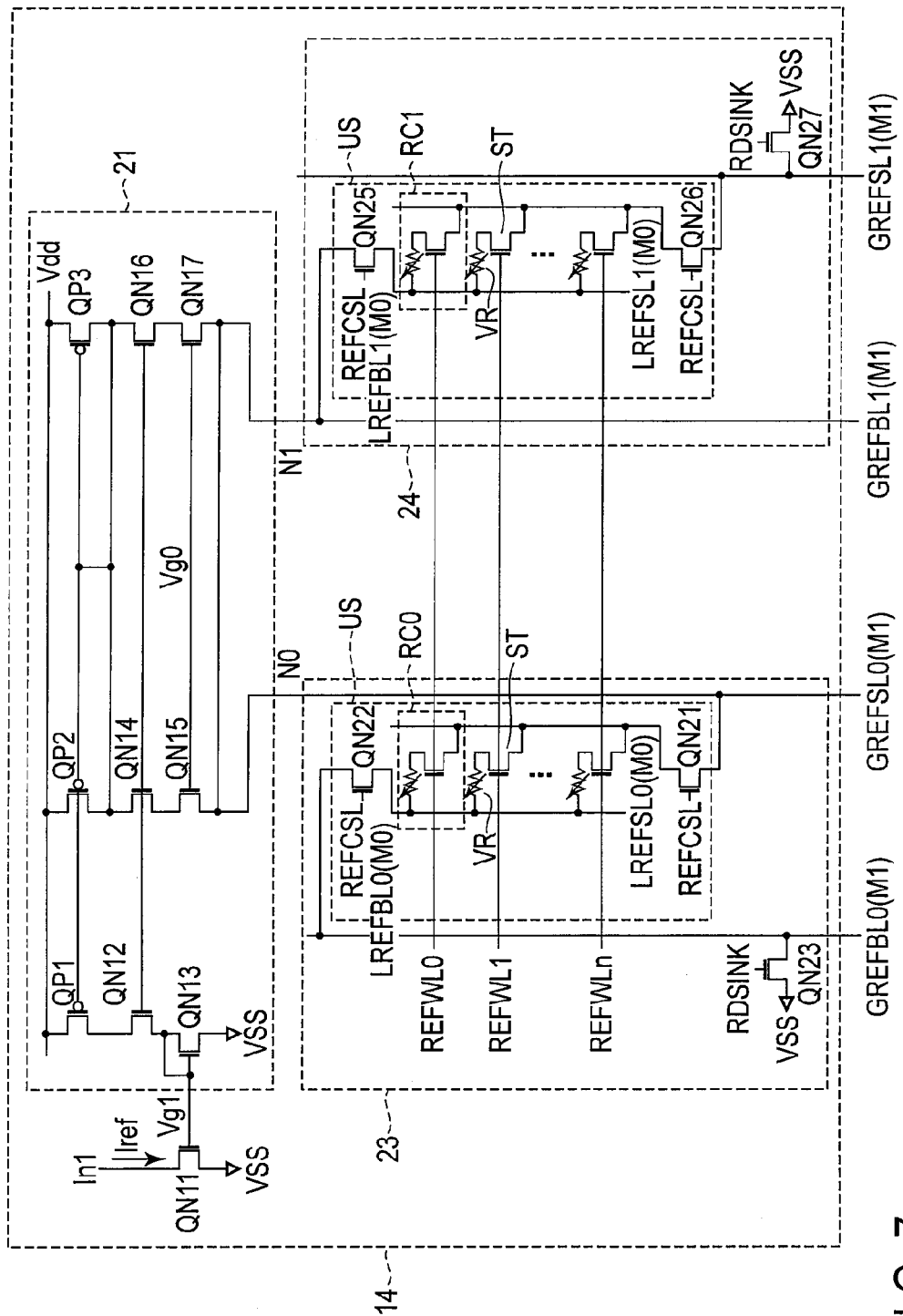
FIG. 7 is a circuit diagram of a part of a memory device according to a first embodiment.

FIG. 7 is a circuit diagram of a part of the memory device according to the first embodiment in its part, and in particular the reference signal generator 14. As shown in FIG. 7, an n-type MOSFET QN11 is coupled between the input node In1 of the sense amplifier 11 and a ground potential node (ground node) VSS. The transistor QN11 is configured to pass the reference current Iref. The reference current Iref is designed to be the average of a current flowing through a memory cell MC holding 0 data (referred to as a 0-data current) and a current flowing a memory cell holding 1 data (referred to as a 1-data current).

To this end, the gate node Vg1 of the transistor QN11 is coupled to a current mirror circuit 21. The current mirror circuit 21 includes nodes N0 and N1. The nodes N0 and N1 are coupled to a 0-data-current generator 23 and 1-data-current generator 24, respectively. The current mirror circuit 21 is configured to set the potential of the node Vg1 to make the reference current Iref the average of 0 and 1 data currents in conjunction with the current generators 23 and 24. To this end, the current mirror circuit 21 includes, for example, a p-type MOSFET QP1 and n-type MOSFETs QN12 and QN13 coupled in series between a power supply potential node (or power node) VDD and the ground node VSS as shown in FIG. 7. The connection node of the transistors QN12 and QN13 is coupled to the node Vg1.

The current mirror circuit 21 also includes a p-type MOSFET QP2, and n-type MOSFETs QN14 and QN15 coupled in series between the power node VDD and node N0. The current mirror circuit 21 further includes a p-type MOSFET QP3, and n-type MOSFETs QN16 and QN17 coupled in series between the power node VDD and node N1. The gates of the transistor QP1, QP2, and QP3 are coupled to each other, and coupled to the connection node between the transistors QP2 and QN14 and to the connection node of the transistors QP3 and QN16. The gates of the transistors QN12, QN14, and QN16 are coupled to each other. The gate of the transistor QN15 (or node Vg0) is coupled to the gate of the transistor QN17, and to the gate of the transistor QN2 of FIG. 3. The nodes N0 and N1 are coupled to each other.

The 0-data-current generator 23 is configured to generate the 0-data current in the node N0. To this end, the 0-data-current generator 23 includes, for example, a global reference source line GREFSL0 coupled to the node N0, a global reference bit line GREFBL0, a unit structures US between them, and an n-type MOSFET QN23. In the 0-data-current generator 23, two select transistors, a local source line, a local bit line, and cells of the unit structures US are referred to as transistors QN21 and QN22, a local reference source line LREFSL0, a local reference bit line LREFBL0, and reference cells RC0, respectively. The unit structure US in the 0-data-current generator 23 includes, for example, n+1 cells. The local reference bit line LREFBL0 and local reference source line LREFSL0 are formed in the M0 interconnect layer, whereas the global reference bit line GREFBL0 and global reference source line GREFSL0 are formed in the M1 interconnect layer.

The transistor QN21 is an n-type MOSFET and coupled between the global reference source line GREFSL0 and local reference source line LREFSL0. The transistor QN22 is an n-type MOSFET and coupled between the global reference bit line GREFBL0 and local reference bit line LREFBL0. The transistors QN21 and QN22 receive a signal REFCSL from a controller (not shown) at their gates. The signal REFCSL is made high when the 0-data-current generator 23 is enabled.

Each of the reference cells RC0 has the same structure as a memory cells MC, i.e., comprises a stack of layers derived from those of the memory cell MC and includes a variable resistance element VR and a transistor ST coupled in series. The reference cells RC0 are coupled at their respective transistor sides to the local reference source line LREFSL0, and at their variable-resistance-element sides to the local reference bit line LREFBL0. The reference cells RC0, from one closest to the transistor QN22 to one closest to the transistor QN21, belong to $0^{th}$ to $n^{th}$ rows, respectively. Respective transistors ST of reference cells RC0 of $0^{th}$ to $n^{th}$ rows are coupled to reference word lines REFWL0 to REFWLn at their gates, respectively. During reads, the transistors QN22 and QN21 are turned on, and one of the reference word lines REFWL0 to REFWLn is selected. As a result, a selected reference cell RC0 is coupled between the global reference source line GREFSL0 and global reference bit line GREFBL0.

The global reference bit line GREFBL0 is grounded via the transistor QN23. The transistor QN23 receives the signal RDSINK from a controller (not shown) at its gate. The signal RDSINK is made high during reads.

The 1-data-current generator 24 is configured to generate the 1-data current in the node N1. To this end, the 1-data-current generator 23 includes, for example, a global reference bit line GREFBL1 coupled to the node N1, a global reference source line GREFSL1, a unit structures US between them, and an n-type MOSFET QN27. In the 1-data-current generator 24, two select transistors, a local source line, a local bit line, and cells of the unit structures US are referred to as transistors QN25 and QN26, a local reference source line LREFSL1, a local reference bit line LREFBL1, and reference cells RC1, respectively. The unit structure US in the 1-data-current generator 24 includes, for example, n+1 cells. The local reference bit line LREFBL1 and local reference source line LREFSL1 are formed in the M0 interconnect layer, whereas the global reference bit line GREFBL1 and global reference source line GREFSL1 are formed in the M1 interconnect layer.

The transistor QN25 is an n-type MOSFET and coupled between the global reference bit line GREFBL1 and local reference bit line LREFBL1. The transistor QN26 is an n-type MOSFET and coupled between the global reference source line GREFSL1 and local reference source line LREFSL1. The transistors QN25 and QN26 receive the signal REFCSL from a controller (not shown) at their gates.

Each of the reference cells RC1 has the same structure as a memory cell MC, i.e., comprises a stack of layers derived from those of the memory cell MC and includes a variable resistance element VR and a transistor ST coupled in series. The reference cells RC1 are coupled at their respective transistor sides to the local reference source line LREFSL1, and at their variable-resistance-element sides to the local reference bit line LREFBL1. The reference cells RC1, from one closest to the transistor QN25 to one closest to the transistor QN26, belong to $0^{th}$ to $n^{th}$ rows, respectively. Respective transistors ST of reference cells RC1 of $0^{th}$ to $n^{th}$ rows are coupled to the reference word lines REFWL0 to REFWLn at their gates, respectively. During reads, the transistors QN25 and QN26 are turned on, and one of the reference word lines REFWL0 to REFWLn is selected. As a result, a selected reference cell RC1 is coupled between the global reference source line GREFSL1 and global reference bit line GREFBL1.

The global reference source line GREFSL1 is grounded via the transistor QN27. The transistor QN27 receives the signal RDSINK at its gate.

With the above components and connections of the 0-data-current generator 23, the node N0 is coupled to the global reference source line GREFSL0, and the global reference bit line GREFBL0 is coupled to the transistor QN23 for grounding. Specifically, the node N0 is coupled to the transistors ST of the reference cells RC0 via the global reference source line GREFSL0 and local reference source line LREFSL0, and the variable resistance elements VR of the reference cells RC0 are grounded via the local reference bit line LREFBL0, global reference bit line GREFBL0, and transistor QN23. For this reason, during 0-data-current generation, the 0-data current from the node N0 flows through a selected reference cell RC0 from the transistor side to the variable-resistance-element side. Specifically, the 0-data current flows through the reference cell RC0 in the same direction as that of the 0-data-write current.

In contrast, with the above components and connections of the 1-data-current generator 24, the node N1 is coupled to the global reference bit line GREFBL1, and the global reference source line GREFSL1 is coupled to the transistor QN27 for grounding. Specifically, the node N1 is coupled to the variable resistance elements VR of the reference cells RC1 via the global reference bit line GREFBL1 and local reference bit line LREFBL1, and the transistors ST of the reference cells RC1 are grounded via the local reference source line LREFSL1, global reference source line GREFSL1, and transistor QN27. For this reason, during 1-data-current generation, the 1-data current from the node N1 flows through a selected reference cell RC1 from the variable-resistance-element side to the transistor side. Specifically, the 1-data current flows through the reference cell RC1 in the same direction as that of the 1-data-write current.

Thus, in both reference cells RC0 and RC1, a current flows in the same direction as that of the current for writing data stored in these reference cells RC0 and RC1. This avoids unintentional data switches of the reference cells RC0 and RC1.

Moreover, connections of the 0-data-current generator 23 are implemented with changes, from connections of FIG. 1, of a component to which the global reference bit line GREFBL0 is coupled and a component to which the transistor for grounding the 0-data-current generator 23 (QN23) is coupled. This is contrastive to FIG. 2, which requires a change of component to which the local bit line is coupled in order to change the FIG. 1 connections. Where connections are changed in FIG. 2 is positioned in the densest component area, which requires a regular arrangement pattern, and therefore disrupting the regularity complicates a manufacturing process. In contrast, a layer for the global reference bit line GREFBL0 (for example, the M1 interconnect layer) or a contact layer coupled to the M1 interconnect layer has a less component density than the densest component area. For this reason, implementing the current generator 23 does not raise the difficulty of the manufacturing process. In other words, the basic structure of the unit structure US (i.e., components and connections for regards other than the number of cells) of the 0-data-current generator 23 remains the same as that of the unit structures US of the 1-data-current generator 24 and the memory cell array 2. The basic structure is maintained, and therefore no special manufacturing process change for the 0-data-current generator 24 is necessary, which in turn maintains the difficulty of the manufacturing process. Note that the connection of the transistor QN23 also does not occur in the densest component area, and therefore does not affect the difficulty of the manufacturing process. Furthermore, in order to maintain periodicity, a transistor coupled between the global reference source line GREFSL0 and ground node may be formed. Then, only the transistor QN23 is used. This even avoids necessity to change the destination to which the transistor QN23 for grounding the 0-data-current generator 23 is coupled.

Note that the description so far has been given with the current detection type sense amplifier and reference current Iref. A voltage detection type sense amplifier, however, also compares a voltage at a data cell side and that at a reference side, and therefore suffers from the same problem as that for the above current detection type sense amplifier. Then, the first embodiment is applicable to the voltage detection type sense amplifier to produce the same advantages. In other words, the first embodiment is applicable to any of a current detection type and a voltage detection type.

As described above, according to the first embodiment, the reference cells RC0 are electrically coupled to the node N0 at the transistor sides and selectively grounded at the variable-resistance-element sides, whereas the reference cells RC1 are coupled to the node N1 at the variable-resistance-element sides and selectively grounded at the transistor sides. For this reason, in both reference cells RC0 and RC1, a current flows in the same direction as that of the current for writing data stored in these reference cells RC0 and RC1. This results in prevention of unintentional data switches of the reference cells RC0 and RC1. Furthermore, such advantages are realized by change of connections in less dense component areas, which does not require the rise of the difficulty of the manufacturing process. This suppresses the rise of the defect rate of the memory device 1 as opposed to the structure of FIG. 2, etc.

Second Embodiment

Figure 8:
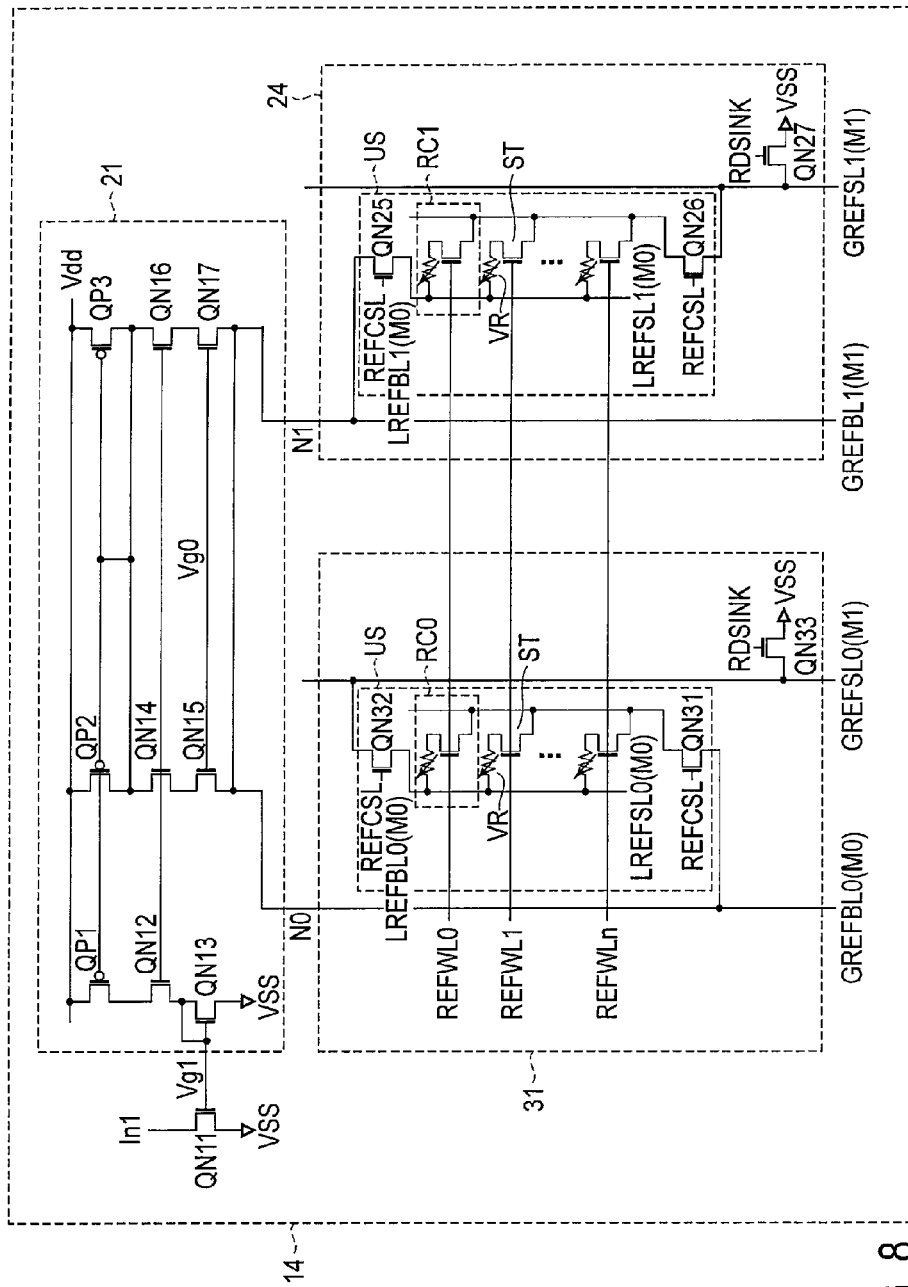
FIG. 8 is a circuit diagram of a part of a memory device according to a second embodiment.

In the second embodiment, the 0-data-current generator has different connections from those of the first embodiment. FIG. 8 is a circuit diagram of a memory device according to the second embodiment in its part, and in particular the reference signal generator 14. As shown in FIG. 8, the reference signal generator 14 includes 0-data-current generator 31 instead of the 0-data-current generator 23 of the first embodiment (FIG. 7). The 0-data-current generator 31 includes a global reference bit line GREFBL0 coupled to the node N0, a global reference source line GREFSL0, a unit structures US coupled between them, and a n-type MOSFET QN33.

In the 0 data current generator 31, two select transistors, a local source line, a local bit line, and cells of the unit structure US are referred to as transistors QN31 and QN32, a local reference source line LREFSL0, a local reference bit line LREFBL0, and reference cells RC0, respectively. The unit structure US in the 0-data-current generator 31 includes, for example, n+1 cells.

The transistor QN31 is an n-type MOSFET and coupled between the global reference bit line GREFBL0 and local reference source line LREFSL0. The transistor QN32 is an n-type MOSFET and coupled between the global reference source line GREFSL0 and local reference bit line LREFBL0. The transistors QN31 and QN32 receive the signal REFCSL from a controller (not shown) at their gates. The global reference source line GREFSL0 is grounded via the transistor QN33. The transistor QN33 receives the signal RDSINK at its gate.

With the above components and connections of the 0-data-current generator 31, the node N0 is coupled to the global reference bit line GREFSL0, and the global reference source line GREFSL0 is coupled to the transistor QN33 for grounding. Specifically, the node N0 is coupled to the transistors ST of the reference cells RC0 via the global reference bit line GREFBL0 and local reference source line LREFSL0, and the variable resistance elements VR of the reference cells RC0 are grounded via the local reference bit line LREFBL0, global reference source line GREFSL0, and transistor QN33. For this reason, during 0-data-current generation, the 0-data current from the node N0 flows through a selected reference cell RC0 from the transistor side to the variable-resistance-element side. Specifically, the 0-data current flows through the reference cell RC0 in the same direction as that of the 0-data-write current as in the first embodiment.

Moreover, connections of the current generator 31 are implemented with changes, from connections of FIG. 1, of a component to which the global reference bit line GREFBL0 is coupled and a component to which the global reference source line GREFSL0 is coupled as in the first embodiment. In other words, they are implemented by change of connections in an area with less dense component area than the densest component area, and the basic structure of the unit structure US is maintained. For this reason, implementing the current generator 31 does not raise the difficulty of the manufacturing process.

As described above, according to the second embodiment, the reference cells RC0 are electrically coupled to the node N0 at the transistor sides and selectively grounded at the variable-resistance-element sides, whereas the reference cells RC1 are coupled to the node N1 at the variable-resistance-element sides and are selectively grounded at the transistor sides as in the first embodiment. This produces the same advantages as those of the first embodiment. Furthermore, such advantages are realized by change of connections in less dense component areas, which does not require the rise of the difficulty of the manufacturing process as in the first embodiment.

Third Embodiment

In the third embodiment, the memory device 1 includes a reference signal generator 41 instead of the reference signal generator 14 of the first embodiment. FIG. 9 is a circuit diagram of a memory device according to the third embodiment in its part, and in particular the reference signal generator 41.

The reference signal generator 41 supplies the reference current Iref which has the magnitude of the average of the 0-data current and the 1-data current to the input In1 as in the reference signal generator 14. Components and connections for it, however, differ from those of the reference signal generator 14.

The gate node Vg1 of the transistor QN11 is coupled to a current mirror circuit 42. The current mirror circuit 42 includes a node N2. The node N2 is coupled to a current generator 43. The current mirror circuit 42 is configured to set the potential of the node Vg1 to make the reference current Iref the average of 0-data and 1-data currents in conjunction with the current generator 43. To this end, the current mirror circuit 42 includes, for example, a p-type MOSFET QP11 and n-type MOSFETs QN41 and QN42 coupled in series between the power node VDD and ground node VSS as shown in FIG. 9. The connection node of the transistors QN41 and QN42 is coupled to the node Vg1.

The current mirror circuit 42 also includes a p-type MOSFET QP12 and n-type MOSFETs QN43 and QN44 coupled in series between the power node VDD and node N2. The gates of the transistors QP11 and QP12 are coupled to the connection node between the transistors QP12 and QN43. The gates of the transistors QN41 and QN43 are coupled to the connection node between the transistors QP11 and QN41. The gate of the transistor QN44 is the node Vg0.

The current generator 43 includes a global reference bit line GREFBL coupled to the node N2, and unit structures US0 and US1, a global reference source line GREFSL, and a transistor QN55.

In the unit structure US1, two select transistors, a local source line, a local bit line, and cells of the unit structure US are referred to as transistors QN51 and QN52, a local reference source line LREFSL1, a local reference bit line LREFBL1, and reference cells RC1, respectively. The unit structure US1 includes, for example, n+1 cells. The transistor QN51 is an n-type MOSFET and coupled between the global reference bit line GREFBL and local reference bit line LREFBL1. The transistor QN52 is an n-type MOSFET and is coupled at its one end to the local reference source line LREFSL1. The transistors QN51 and QN52 receive the signal REFCSL from a controller (not shown) at their gates.

In the unit structure US0, two select transistors, a local source line, a local bit line, and cells of the unit structure US are referred to as transistors QN53 and QN54, a local reference source line LREFSL0, a local reference bit line LREFBL0, and reference cells RC0, respectively. The unit structure US0 includes, for example, n+1 cells. The transistor QN53 is an n-type MOSFET and coupled between the transistor QN52 and local reference source line LREFSL0. The transistor QN54 is an n-type MOSFET and coupled between the local reference bit line LREFBL0 and global reference source line GREFSL. The transistors QN53 and QN54 receive the signal REFCSL from a controller (not shown) at their gates. The global reference source line GREFSL is grounded via the transistor QN55. The transistor QN55 receives the signal RDSINK at its gate.

The gate of each transistor ST is coupled to one of the reference word lines REFWL0 to REFWLn as in the first embodiment. During reads, the transistors QN51 to QN54 are turned on, and one of the reference word lines REFWL0 to REFWLn is selected. As a result, a selected reference cell RC0 and a selected reference cell RC1 are coupled between the global reference source line GREFSL and global reference bit line GREFBL. The global reference source line GREFSL and global reference bit line GREFBL are formed in the M1 interconnect layer as are in the memory cell array 2. The connection between the transistors QN52 and QN53 is also implemented by the M1 interconnect layer or the contact layer coupled to the M1 interconnect layer (and suitable change of its position).

With such components and connections of the current generator 41, the node N2 is coupled to the variable resistance elements VR of the reference cells RC1 via the global reference bit line GREFBL and local reference bit line LREFBL1. Moreover, the transistors ST of the reference cells RC1 are coupled to the transistors ST of the reference cells RC0 via the local reference source lines LREFSL1 and LREFSL0. Furthermore, the variable resistance elements VR of the reference cells RC0 are grounded via the local reference bit line LREFBL0, global reference source line GREFSL, and transistor QN55. For this reason, during generation of the reference current Iref, the current from the node N2 flows through a selected reference cell RC1 from its variable-resistance-element side to its transistor side, and then flows through a selected reference cell RC0 from its transistor side to its variable-resistance-element side. Specifically, the current flows through a reference cell RC1 in the same direction as that of the 1-data write current, and flows through a reference cell RC0 in the same direction as that of the 0-data write current.

Thus, in both reference cells RC0 and RC1, a current flows in the same direction as that of the current for writing data stored in these reference cells RC0 and RC1. This avoids unintentional data switches of the reference cells RC0 and RC1.

Moreover, the current generator 41 is implemented with changes, from components and connections of FIG. 1, of a component to which the global reference bit line GREFBL and a component to which the global reference source line GREFSL is coupled as in the first embodiment. In other words, it is implemented by change of connection in an area with less dense component area than the densest component area, and the basic structure of the unit structure US is maintained. The connecting line between the transistors QN52 and QN53 is also formed in such less dense component area. For this reason, implementing the current generator 41 does not raise the difficulty of the manufacturing process.

As described above, according to the third embodiment, the reference cells RC1 are coupled to the node N2 at their variable-resistance-element sides, and the reference cells RC0 are coupled to the transistor QN53 at their transistor sides and are selectively grounded at their variable-resistance-element sides. For this reason, in both reference cells RC0 and RC1, a current flows in the same direction as that of the current for writing data stored in these reference cells RC0 and RC1 as in the first embodiment. This produces the same advantages as those of the first embodiment. Furthermore, such advantages are realized by change of connections in less dense component areas, which does not require the rise of the difficulty of the manufacturing process as in the first embodiment.

The configuration of the overall memory device 1, memory cell array, memory cells, and the sense amplifier 11 are not limited to the above example. For example, it is possible to use those disclosed in the U.S. Pat. No. 7,649,792 specification and the United States Patent application publication No. 2012/0286339, entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
 a memory cell;
 a sense amplifier comprising a first input and a second input, and configured to output a signal based on a difference between the first and second inputs and be selectively coupled at the second input to the memory cell;
 unit structures each comprising a first end, a first transistor, a first local line, a variable resistance element, a second transistor, a second local line, and a third transistor coupled in series; and
 a reference signal generator coupled to the first input of the sense amplifier and comprising:
  a first global line selectively grounded and a second global line selectively grounded;
  a third global line and a fourth global line; and
  a first unit structure and a second unit structure of the unit structures, wherein
 the first unit structure is coupled at the first end to the first global line and coupled at the second end to the third global line, and the second unit structure is coupled at the first end to the fourth global line and coupled at the second end to the second global line.

2. The device of claim 1, wherein the variable resistance element of the first unit structure stores first data, and the variable resistance element of the second unit structure stores second data.

3. The device of claim 2, wherein the variable resistance element of the first unit structure comprises a magnetoresistive effect element, and the variable resistance element of the second unit structure comprises a magnetoresistive effect element.

4. The device of claim 3, wherein each of the magnetoresistive effect elements has a resistance which varies in accordance with a direction of a current which flows through that magnetoresistive effect element.

5. The device of claim 4, wherein the memory cell comprises a magnetoresistive effect element.

6. The device of claim 5, wherein a third unit structure of the unit structures uses the variable resistance element and the second transistor as the memory cell.

7. The device of claim 1, wherein the first and second local lines are in a first level above a substrate, and the first to fourth global lines are in a second level above the first level.

8. The device of claim 1, wherein the reference signal generator is configured to conduct a current from the third global line to the first global line and a current from the fourth global line to the second global line during a read.

9. The device of claim 1, further comprising: a fourth transistor between the first global line and a ground node; and a fifth transistor between the second global line and a ground node.

10. The device of claim 1, wherein the first global line is a first global bit line, and the third global line is a first global source line.

11. The device of claim 1, wherein the third global line is a first global bit line, the first global line is a first global source line, the fourth global line is a second global bit line, and the second global line is a second global source line.

12. The device of claim 11, wherein the first and second local lines are in a first level above a substrate, and the first and second global lines are in a second level above the first level.

13. The device of claim 11, wherein the reference signal generator is configured to conduct a current from the first global line to the second global line during a read.

14. The device of claim 11, further comprising a fourth transistor between the second global line and a ground node.

15. A memory device comprising:
   a memory cell;
   a sense amplifier comprising a first input and a second input, and configured to output a signal based on a difference between the first and second inputs and be selectively coupled at the second input to the memory cell;
   unit structures each comprising a first end, a first transistor, a first local line, a variable resistance element, a second transistor, a second local line, and a third transistor coupled in series; and
   a reference signal generator coupled to the first input of the sense amplifier and comprising:
      a first global line;
      a second global line selectively grounded; and
      a first unit structure and a second unit structure of the unit structures, wherein
   the first unit structure is coupled at the first end to the first global line,
   the second ends of the first and second unit structures are coupled to each other, and
   the second unit structure is coupled at the first end to the second global line.

16. The device of claim 15, wherein the variable resistance element of the first unit structure stores first data, and the variable resistance element of the second unit structure stores second data.

17. The device of claim 16, wherein the variable resistance element of the first unit structure comprises a magnetoresistive effect element, and the variable resistance element of the second unit structure comprises a magnetoresistive effect element.

18. The device of claim 17, wherein each of the magnetoresistive effect elements has a resistance which varies in accordance with a direction of a current which flows through that magnetoresistive effect element.

19. The device of claim 18, wherein the memory cell comprises a magnetoresistive effect element.

20. The device of claim 19, wherein a third unit structure of the unit structures uses the variable resistance element and the second transistor as the memory cell.

* * * * *